(12) United States Patent
Atwood et al.

(10) Patent No.: US 10,165,689 B1
(45) Date of Patent: Dec. 25, 2018

(54) METHOD FOR FORMING CIRCUITS FOR THREE-DIMENSIONAL PARTS AND DEVICES FORMED THEREBY

(71) Applicant: XEROX CORPORATION, Norwalk, CT (US)

(72) Inventors: Christopher Douglas Atwood, Webster, NY (US); Elizabeth Crossen, Churchville, NY (US); Mark A. Adiletta, Fairport, NY (US); Jeffrey J. Bradway, Rochester, NY (US); Paul J. McConville, Webster, NY (US)

(73) Assignee: XEROX CORPORATION, Norwalk, CT (US)

( * ) Notice: Subject to any disclaimer, the term of this patent is extended or adjusted under 35 U.S.C. 154(b) by 33 days.

(21) Appl. No.: 15/691,227

(22) Filed: Aug. 30, 2017

(51) Int. Cl.
| | |
|---|---|
| *H05K 3/00* | (2006.01) |
| *H05K 1/03* | (2006.01) |
| *H05K 3/12* | (2006.01) |
| *H05K 3/46* | (2006.01) |
| *H05K 1/02* | (2006.01) |

(52) U.S. Cl.
CPC ......... *H05K 3/0014* (2013.01); *H05K 1/0284* (2013.01); *H05K 1/032* (2013.01); *H05K 3/12* (2013.01); *H05K 3/4602* (2013.01); *H05K 2201/0129* (2013.01); *H05K 2201/09118* (2013.01); *H05K 2203/1453* (2013.01)

(58) Field of Classification Search
CPC ............................ H05K 3/0014; H05K 1/032
See application file for complete search history.

(56) References Cited

U.S. PATENT DOCUMENTS

| | | | |
|---|---|---|---|
| 5,264,061 A | 11/1993 | Juskey et al. | |
| 5,659,153 A | 8/1997 | Narayan et al. | |
| 2009/0002973 A1* | 1/2009 | Watanabe | H01L 24/18 |
| | | | 361/820 |
| 2013/0144422 A1* | 6/2013 | Choi | A61C 1/084 |
| | | | 700/119 |
| 2014/0113464 A1* | 4/2014 | Tran | H01L 23/49833 |
| | | | 439/77 |
| 2014/0210026 A1 | 7/2014 | Karlsson et al. | |
| 2014/0216791 A1 | 8/2014 | Karlsson et al. | |

FOREIGN PATENT DOCUMENTS

| | | |
|---|---|---|
| CN | 105905867 A1 | 8/2016 |
| EP | 3001780 A1 | 3/2016 |
| WO | WO 2014/005591 A1 | 1/2014 |

* cited by examiner

*Primary Examiner* — Jeremy C Norris
(74) *Attorney, Agent, or Firm* — MH2 Technology Law Group LLP

(57) ABSTRACT

A process for thermoforming a circuit onto a three-dimensional part comprises applying electrically conductive lines on a substrate to form a flexible circuit. The flexible circuit is heated to a temperature sufficient to thermoform the substrate into a shape that conforms to said three-dimensional part and attached to the three-dimensional part.

19 Claims, 6 Drawing Sheets

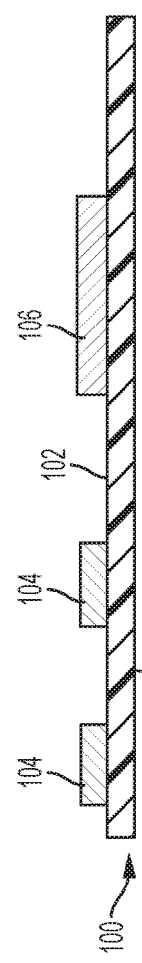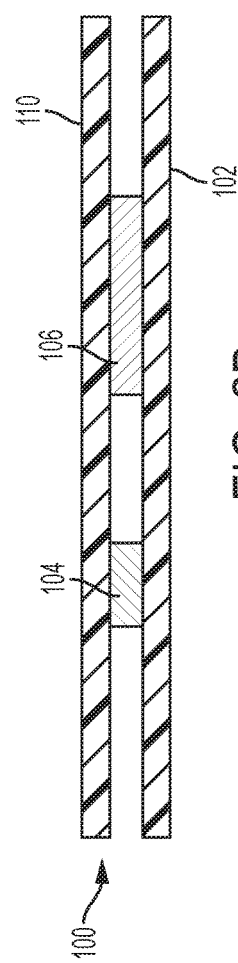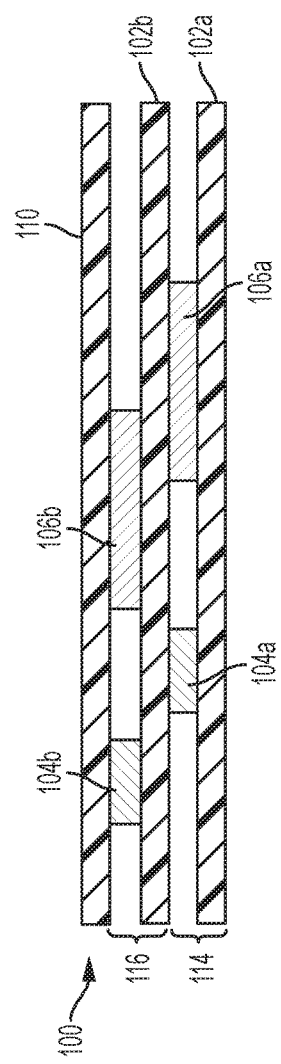

METHOD FOR FORMING CIRCUITS FOR THREE-DIMENSIONAL PARTS AND DEVICES FORMED THEREBY

DETAILED DESCRIPTION

Field of the Disclosure

The present disclosure is directed to a method of providing an electrical circuit to a three-dimensional part, and three-dimensional devices comprising circuits conformed thereto.

Background

Providing solid state electrical circuits for today's electronics is often accomplished using printed circuit boards designed for specific applications. However, printed circuit boards are generally made using planar, rigid substrates and have limitations, such as in applications where a three-dimensional object being manufactured provides space or shape constraints on the circuit board. One such example is the use of printed circuit boards for objects made by three-dimensional printing techniques, where the object being printed is relatively small and/or does not have sufficient usable planar space for attaching the circuit board.

Flexible circuits are known for use in aerospace applications, where the flexible circuits are commonly used to save weight from traditional circuit boards and/or to be able to fit circuits into unique shapes. However, traditional flexible circuits can sometimes not conform well to a three-dimensional object. Also, in certain applications where flexing of the circuit occurs, the flexible circuit can deteriorate after many flex cycles.

Novel flexible circuits and methods for making such circuits for use with three-dimensional applications, such as devices made using three-dimensional printing, would be a welcome addition to the art.

SUMMARY

An embodiment of the present disclosure is directed to a process for thermoforming a circuit onto a three-dimensional part. The process comprises applying electrically conductive lines on a substrate to form a flexible circuit. The flexible circuit is heated to a temperature sufficient to thermoform the substrate into a shape that conforms to said three-dimensional part and attached to the three-dimensional part.

Another embodiment of the present disclosure is directed to a device. The device comprises a three-dimensional part having an outer surface. A substrate comprising a thermoplastic material conforms to the outer surface of the three-dimensional part. Electrically conductive lines on the substrate form an electrical circuit.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

FIG. 2A illustrates a flexible circuit, according to an embodiment of the present disclosure.

FIG. 2B illustrates a flexible circuit including a protective film, according to an embodiment of the present disclosure.

FIG. 2C illustrates a flexible, multi-layer electrical circuit, according to an embodiment of the present disclosure.

Figure 1:
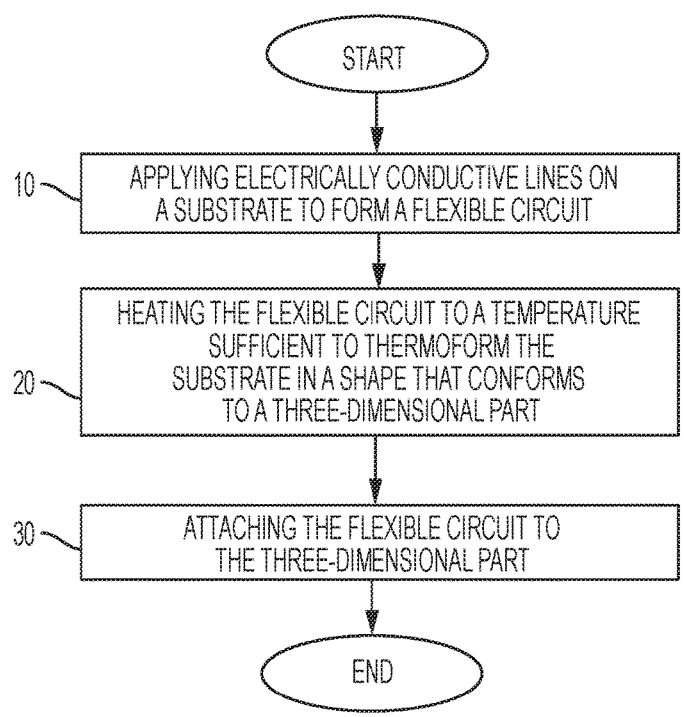
FIG. 1 shows a flowchart of a method for thermoforming a circuit onto a three-dimensional part, according to an embodiment of the present disclosure.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawings that forms a part thereof, and in which is shown by way of illustration a specific exemplary embodiment in which the present teachings may be practiced. The following description is, therefore, merely exemplary.

An embodiment of the present disclosure is directed to a method for thermoforming a circuit onto a three-dimensional part. As shown in the flowchart of FIG. 1, the method comprises a sub-process 10 of applying electrically conductive lines on a substrate to form a flexible circuit. At sub-process 20, the flexible circuit is heated to a temperature sufficient to thermoform the substrate in a shape that conforms to said three-dimensional part. At sub-process 30, the flexible circuit is attached to the three-dimensional part. Sub-processes 20 and 30 can be performed in any order, such as by performing sub-process 20 prior to sub-process 30, after sub-process 30 or simultaneously with sub-process 30.

Sub-Process 10—Forming a Flexible Circuit

FIG. 2A illustrates a flexible circuit 100, according to an embodiment of the present disclosure. Flexible circuit 100 comprises a substrate 102 and electrically conductive lines 104 on the substrate 102.

The substrate 102 can be, for example, a free-standing, planar film of material capable of deforming so as to conform to a non-planar surface of a three-dimensional part. The thickness of substrate 102 can range, for example, from about 0.005 inches to about 0.750 inches, such as about 0.010 inches to about 0.40 inches, or about 0.050 inches to about 0.125 inches.

In an embodiment, substrate 102 comprises a thermoplastic material. Examples of well known thermoplastic materials traditionally used in thermoforming applications include materials selected from the group consisting of acrylonitrile butadiene styrene ("ABS"), polystyrene, polycarbonate, acrylic, Polyvinyl chloride ("PVC"), poly(ethylene terephthalate) ("PET") and polyethylene, or combinations thereof. Any other suitable thermoplastic materials can also be employed.

Figure 6:
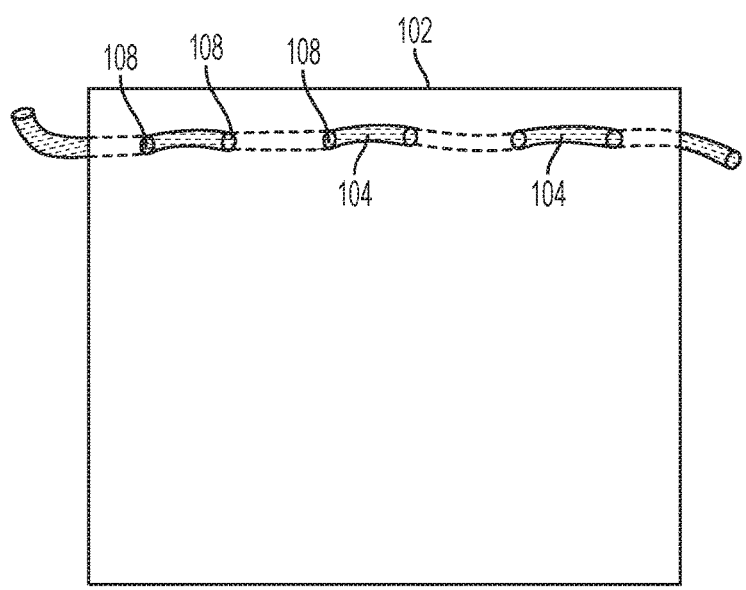
FIG. 6 illustrates a preformed wire woven through holes in a substrate to form electrically conductive lines, according to an embodiment of the present disclosure.

The electrically conductive lines 104 can be applied to substrate 102 by any suitable technique. For example, the conductive line 104 can be applied by printing a conductive ink on the substrate 102, such as by inkjet printing, screen printing, or other printing processes suitable for printing conductive materials onto a planar substrate. Other suitable processes for applying the electrically conductive lines 104 to substrate 102 include any suitable deposition and patterning method, such as liquid or vapor deposition and photolithographic patterning processes, which are well known in the art. Still other processes can include bonding a preformed conductive line 104 to the substrate 102, such as by positioning and bonding a metal foil or metal wire onto the substrate 102 so as to form a circuit. For example, metal wires can be formed by laser cutting and then bonded to the substrate 102 to form a circuit. In yet another example, preformed wire can be woven through holes 108 in the substrate 102 to form electrically conductive lines 104, as shown in FIG. 6.

Conductive lines 104 can comprise any suitable conductive material that is capable of forming a flexible circuit that can withstand the heating and deforming processes employed to conform the circuit to a three-dimensional part. In an embodiment, the electrically conductive lines 104 comprise a material selected from the group consisting of silver, silver alloys, copper, copper alloys, gold, gold alloys, and carbon-based conductive materials, such as graphene, graphite, carbon black and carbon nanotubes, and mixtures of any of the above conductive materials . . . . Alloys of silver, copper and gold are well known in the art and one of ordinary skill in the art would readily be able to select appropriate alloys of these materials for the conductive material of the flexible circuit. The term "carbon-based conductive material" refers to any material that contains at least 5 wt % carbon and that is electrically conductive at room temperature. Thus, for example, a carbon-based conductive material can be pure carbon in a conductive form, such as graphene, or can be a matrix material comprising carbon particles. A variety of suitable carbon-based conductive materials are well known in the art. In an example, the conductive material is an ink comprising silver, such as an ink comprising silver that is deposited by inkjet printing.

In an embodiment, the circuit comprises one or more contact pads 106. Contact pads 106 are in electrical contact with one or more electrically conductive lines 104, as shown, for example, in FIG. 4. Contact pads 106 can be employed as a place for soldering to lead lines or otherwise connecting to external circuits or any other desired circuit components, such as light emitting diodes, resistors, or other components.

As illustrated in FIG. 2B, the process optionally comprises depositing a protective film 110 on electrically conductive lines 104. Protective film 110 can be the same as or different than substrate 102 and can comprise any of the materials described herein for substrate 102. In an embodiment, the protective film 110 is formed by selectively depositing an insulating material, such as by printing a UV curable insulating material onto one or more, such as all, of the conductive lines 104 and/or contact pads 106. For example, a dielectric ink or coating could be applied to specific areas, such as overtop conductive lines 104 and/or contact pads 106, but not covering a majority of the substrate 102; or alternatively applied over the conductive lines 104 and/or conductive pads 106, as well as a majority of the surface of the substrate 102. The protective film 110 can have any desired function, such as to provide electrical insulation for conductive lines 104 and conductive pads 106 and/or to protect conductive lines 104 and conductive pads 106 from corrosion.

Additionally, black or colored designs could be applied to the substrate to create additional visible but non-conductive features such as labels, indicators, or alignment marks. The black or colored designs may be printed using black or colored inks deposited with an inkjet printer.

In an embodiment, a flexible circuit 100 is a multi-layered electrical circuit, as illustrated in FIG. 2C. The flexible circuit 100 comprises a first sub-circuit 114 comprising a first substrate 102a, electrically conductive lines 104a and/or contact pads 106a; and a second sub-circuit 116 comprising a second substrate 102b having electrically conductive lines 104b and/or contact pads 106b applied thereon and an optional protective film 110. The multi-layered electrical circuit can comprise any number of sub-circuits, such as two, three or four layers of sub-circuits.

Flexible circuit 100 can be made in any desired manner. In an embodiment, the first sub-circuit 114 and second sub-circuit 116 are each made separately, similarly as described above for flexible circuit 100. The second sub-circuit 116 can then be bonded to first sub-circuit 114, such as by solvent bonding, ultrasonic welding, laser welding, induction welding, adhesives and/or any other suitable technique. Any desired number of sub-circuits can be stacked and bonded. Stacking sub-circuits in this manner can allow more complex circuitry to be formed in the same circuit footprint. One or more, such as all, of the sub-circuits can be electrically interconnected using well known or later developed interconnect techniques. Alternatively, the sub-circuits are not interconnected, but instead for independent circuits.

Sub-Process 20—Thermoforming

The flexible circuit 100 can be heated to any temperature that is high enough to allow sufficient deformation so that the flexible circuit 100 can conform to a non-planar surface of a three-dimensional part to which it is to be attached. In an embodiment, the temperature is greater than or equal to a glass transition temperature of the substrate 102. The flexible circuit 100 can be heated in any suitable manner, such as by using an oven, heat plate, radiant energy and/or other techniques.

Figure 3:
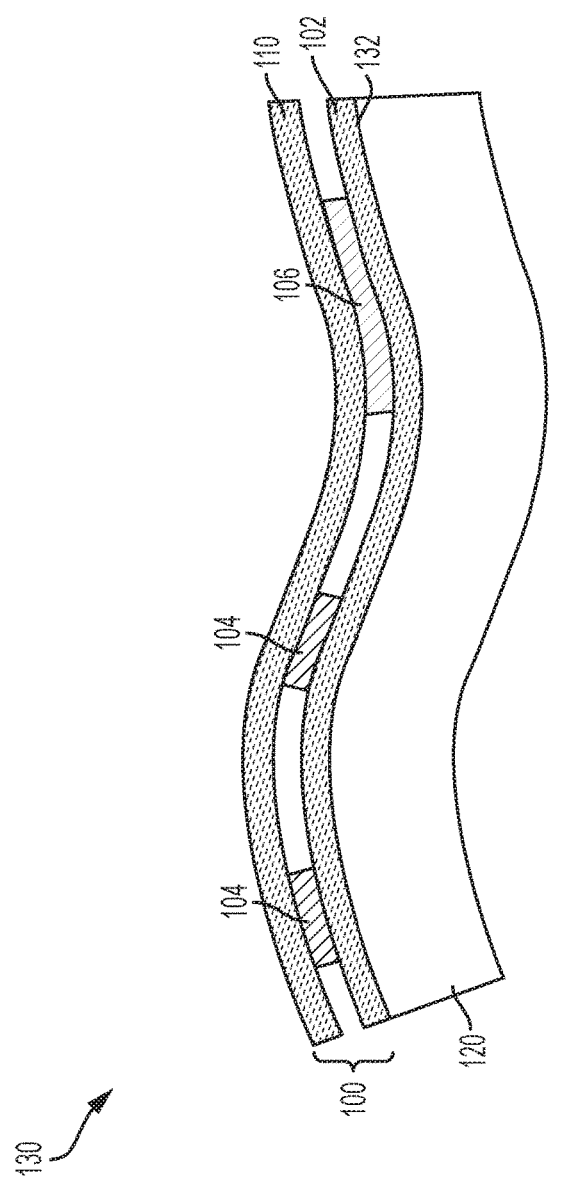
FIG. 3 illustrates a schematic, cross-sectional view of a three-dimensional device, according to an embodiment of the present disclosure.
Figure 4:
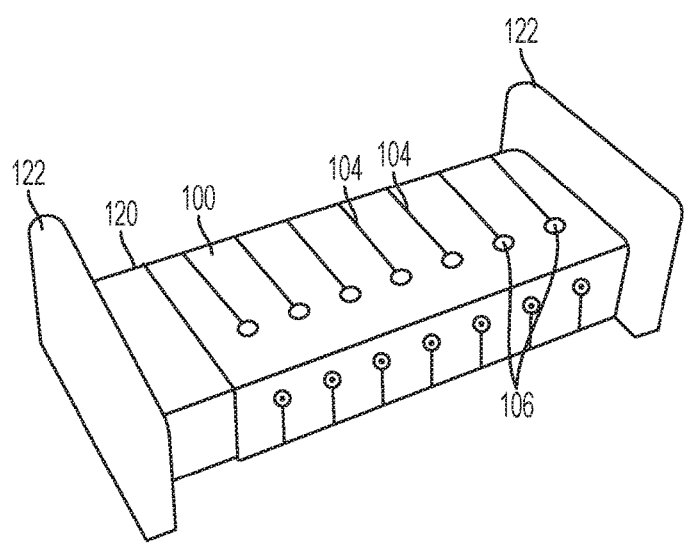
FIG. 4 illustrates a perspective view of a three-dimensional device, according to an embodiment of the present disclosure.
Figure 5:
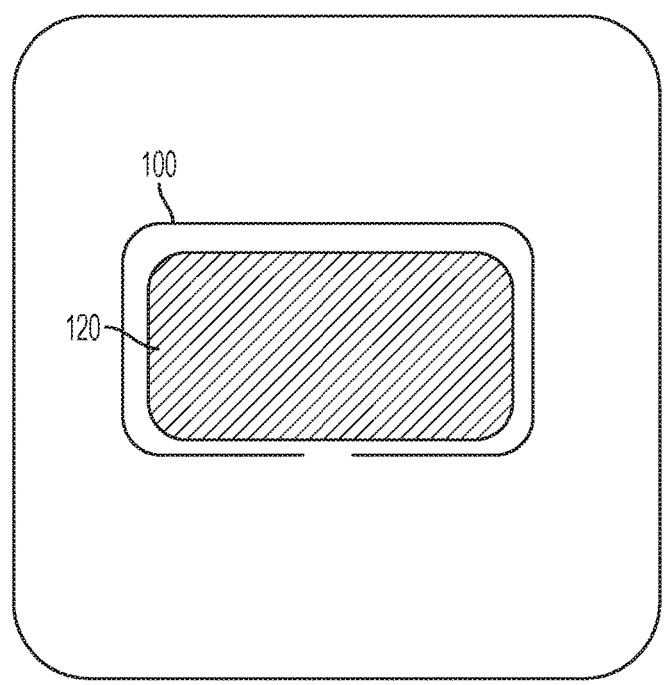
FIG. 5 illustrates a schematic, cross-sectional view of a three-dimensional device, according to an embodiment of the present disclosure.

In an embodiment, following heating the flexible circuit 100 is positioned on a three-dimensional part 120, as Illustrate in FIG. 3. In an embodiment, the flexible circuit 100 conforms to at least one non-planar surface of the three-dimensional part. The flexible circuit can extend over one, two, three, four or more different sides of the part, such as completely around an entire cross-sectional perimeter of the three-dimensional part. FIGS. 4 and 5 show examples of such an example in which a flexible circuit 100 wraps around multiple sides of a three-dimensional part 120, with FIG. 5 illustrating a schematic cross-sectional view showing the flexible circuit 100 wrapped around a cross-sectional perimeter of the three-dimensional part 120.

Flexible circuit 100 can be oriented in any desired manner onto the surface of the three-dimensional part 120. For example, if the flexible circuit 100 of FIG. 2A is used, the substrate 102 can be positioned adjacent the surface of the three-dimensional part 120 so that the conductive material 104,106 is on the exposed outer surface. Alternatively, the conductive material 104,106 can be positioned adjacent the surface of the three-dimensional part 120 so that the conductive material 104,106 is positioned between the substrate 102 and the three-dimensional part.

The flexible circuit 100 can be allowed to cool while positioned so as to conform to the three-dimensional part 120. The flexible circuit 100 cools, becoming relatively rigid at room temperature (e.g., 25° C.) compared to the flexibility of the flexible circuit 100 at or above the glass transition temperature of the substrate 102. After cooling, the flexible circuit 100 retains the shape of the three-dimensional surface on which it is positioned. In this manner the flexible circuit 100 is thermoformed so as to have the desired shape of the surface of the three-dimensional part 120.

In addition to thermoforming, the heating of the flexible circuit can also act to partially or completely sinter the conductive features, including the electrically conductive lines 104 and/or contact pads 106. It is often the case that sintering of metals and other conductive materials is carried out to increase electrical conductivity. The sintering is carried out by heating the conductive features to a sufficiently high temperature for a sufficient length of time to provide the desired increase in conductivity. However, sintering can potentially reduce flexibility of the conductive material. Accordingly, in an embodiment, the conductive features are not sintered or are only partially sintered prior to thermoforming so that the conductive material remains flexible, followed by heating during the thermoforming step to fully sinter (or to complete the sintering process in the case of partial sintering prior to thermoforming). In another embodiment, the entire sintering process can occur prior to the thermoforming step.

Sub-Process 30—Attaching Techniques

Any suitable techniques for attaching the flexible circuit to the three-dimensional part can be employed. In an embodiment, the attaching of the flexible circuit to the three-dimensional part comprises at least one of i) employing an adhesive between the flexible circuit and the three-dimensional part; ii) mechanically fastening the flexible circuit to the three-dimensional part; iii) thermoforming the substrate so that the shape of the substrate is captured on the three-dimensional part; and iv) welding, such as ultrasonic welding or solvent welding.

For attaching techniques using adhesive bonding, any suitable adhesive can be employed, such as, for example, an epoxy adhesive. The type of adhesive may depend on the type of thermoplastic used for the flexible circuit and/or the type of material the three-dimension part is made from. In one example, an epoxy adhesive can be used to join a PLA 3D printed part to a thermoformed flexible circuit having a substrate comprising PET.

For mechanical attaching techniques, separate items like screws, snap clips or other mechanical fasteners can be used to secure the thermoformed circuit to the three-dimensional part. In an embodiment, screw bosses or other features could be printed or formed into the part that can then be used in the mechanical securing process.

FIG. 5 illustrates an example of an attaching technique that involves thermoforming the flexible circuit 100 so that the shape of the substrate 102 is captured on the three-dimensional part 120. This process generally involves wrapping the flexible circuit 100 around enough of the three-dimensional part 120 so that that the flexible circuit 100 is held in place after the shape of the flexible circuit is fixed following thermoforming. The degree to which the flexible circuit 100 extends around the three-dimensional part so as to attach thereto can depend on the shape of three-dimensional part, among other things. For example, the flexible circuit 100 can extend more than 180° around a perimeter of the three-dimensional part, such as more than 225° or more than 270° around a perimeter of the three-dimensional part, or 360° (i.e., completely around the part). In another embodiment, features formed into the three-dimensional part, such as protrusions or indentations (not shown) in the surface can allow the flexible circuit to wrap around only a portion of the three-dimensional part, such as less than 180° around the perimeter, while still effectively attaching onto the features of the three-dimensional part, or otherwise allow the circuit to be retained by only a portion of or one or more topographical features of the three-dimensional part. One of ordinary skill in the art could readily design a part with features for allowing the flexible circuit to attach thereto.

Attaching techniques that comprise welding can employ any welding techniques that are suitable for welding thermoplastics, such as, for example, ultrasonic welding, induction welding, laser welding, or solvent welding, all of which are generally well known in the art. The welds can be made in seams or at selective spot welding locations, as is also generally well known in the welding art.

In an embodiment, the three-dimensional part comprises one or more mounting features that can aid in positioning and/or attaching the flexible circuit 100 onto the three-dimensional part. For instance, three-dimensional part 120 can include flanges 122 that can aid in guiding and maintaining flexible circuit 100 into the correct position with respect to the surface of the three-dimensional part 120. Any other type of guide for positioning the flexible circuit can be employed. Other mounting devices can include devices for attaching the flexible circuit, such as screw holes, clips and/or strain-relief mechanisms positioned in or on the three-dimensional part 120.

In an embodiment, the three-dimensional part 120 is formed by three-dimensional printing and can have any shape that is capable of being 3D printed. The three-dimensional part 120 can comprise any suitable materials, such as one or more of a polymer, elastomer, ceramic, metal or other materials suitable for three-dimensional printing.

In an embodiment, the 3D printed parts can be made of materials that are able to withstand thermoforming temperatures, such as, for example, temperatures above 130° C. (although thermoforming temperatures may vary considerably depending on the materials employed for substrate 102). That said, even if the thermoforming temperatures are somewhat higher than the deformation temperature of the 3D printed part, such relatively high temperatures may create a desired effect, which is that both the circuit and the surface of the three-dimensional part may soften and potentially conform to each other more effectively than if such high temperatures were not employed.

The Device

An embodiment of the present disclosure is directed to a three-dimensional device. Referring to FIG. 3, the three-dimensional device 130 comprises a three-dimensional part 120 having a non-planar outer surface 132. The non-planar surface can comprise one or more curves, stepped surfaces or any other type of non-planar topographical feature. A flexible circuit 100 comprising a thermoplastic material that conforms to the outer surface 132 of the three-dimensional part. The conformal, flexible circuit 100 comprises electrically conductive lines 104 and/or contact pads 106 on substrate 102 that make up an electrical circuit, thereby providing electrical functionality to the three-dimensional device 130.

The three-dimensional part 120 can comprise any of the materials discussed herein for three-dimensional parts. The substrate 102 and the optional protective film 110 can comprise any of the substrate or protective film materials described herein. Multi-stack flexible circuit configurations and/or configurations that do not include protective layer 110, as shown, for example, in FIGS. 2A and 2C, can also be employed in place of the flexible circuit 100 of FIG. 3, as discussed herein.

In an embodiment, the flexible circuit can become relatively rigid compared to the flexibility of the circuit 100 during thermoforming. In an embodiment, after thermoforming, the flexible circuit 100 remains sufficiently flexible at 25° C. so as to allow the three-dimensional part 120 and circuit 100 to move and/or flex together. Such flexible circuit designs can have applications in, for instance, force or impact sensors formed by the method of the present disclosure. The final rigidity or flexibility of circuit 100 can vary depending on the materials employed for the flexible circuit 100, the process conditions used for thermoforming (e.g., the temperatures employed), as well as other factors, as would be understood by one of ordinary skill in the art.

The three-dimensional parts made using the flexible circuits of the present disclosure can have one or more advantages, including: improved ability of the circuit to conform to a three-dimensional part; the ability to fabricate circuits for three-dimensional part having a wide range of sizes and shapes; the ability to provide circuits that conform to a three-dimensional surface, where the circuits are formed on rigid, thermoformed substrates that can avoid the drawbacks of flexible circuits; and the ability of the circuit to conform to and retain the shape of a non-planar surface for long periods of time.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A device comprising:
    a three-dimensional part having an outer surface;
    a flexible circuit comprising a substrate and electrically conductive lines on the substrate, the substrate comprising a thermoplastic material that conforms to the outer surface of the three-dimensional part; and
    the electrically conductive lines forming an electrical circuit;
    wherein the flexible circuit is attached to the three-dimensional part by at least one technique selected from the group consisting of i) an adhesive between the flexible circuit and the three-dimensional part; ii) mechanical fasteners that fasten the flexible circuit to the three-dimensional part; iii) thermoforming the substrate so that the shape of the substrate wraps more than 180° around the three-dimensional part in a manner so that the part is captured on the three-dimensional part; and iv) welding the substrate to the three-dimensional part using a welding process that is suitable for welding the thermoplastic material.

2. The device of claim 1, wherein the three-dimensional part comprises a polymer.

3. The device of claim 1, wherein the thermoplastic material comprises at least one material selected from the group consisting of acrylonitrile butadiene styrene ("ABS"), polystyrene, polycarbonate, acrylic, Polyvinyl chloride ("PVC"), poly(ethylene terephthalate) ("PET") and polyethylene.

4. The device of claim 1, wherein the substrate and electrical circuit conform to at least one non-planar surface of the three-dimensional part.

5. The device of claim 1, wherein the circuit comprises one or more contact pads.

6. The device of claim 1, wherein the electrically conductive lines comprise a material selected from the group consisting of silver, silver alloys, copper, copper alloys, gold, gold alloys, carbon-based conductive material, and mixtures thereof.

7. The device of claim 1, wherein the flexible circuit is a first sub-circuit of a multi-layer electrical circuit, the multi-layer electrical circuit further comprising:
    a second substrate comprising a thermoplastic material on the first sub-circuit; and
    second electrically conductive lines on the second substrate.

8. The device of claim 1, wherein after thermoforming, the flexible circuit remains flexible enough to allow the part and circuit to move together.

9. A process for thermoforming a circuit onto a three-dimensional part, the process comprising:
    applying electrically conductive lines on a substrate comprising a thermoplastic material to form a flexible circuit;
    heating the flexible circuit to a temperature sufficient to thermoform the substrate into a shape that conforms to said three-dimensional part; and
    attaching the flexible circuit to the three-dimensional part, wherein attaching of the flexible circuit to the three-dimensional part comprises at least one technique selected from the group consisting of i) employing an adhesive between the flexible circuit and the three-dimensional part; ii) mechanically fastening the flexible circuit to the three-dimensional part; iii) thermoforming the substrate so that the shape of the substrate wraps more than 180° around the three-dimensional part in a manner so that the part is captured on the three-dimensional part; and iv) welding the substrate to the three-dimensional part using a welding process that is suitable for welding the thermoplastic material.

10. The process of claim 9, wherein the applying of the electrically conductive lines comprises one of printing a conductive ink on the substrate and bonding a preformed conductive line to the substrate.

11. The process of claim 9, wherein the three-dimensional part is formed by three-dimensional printing.

12. The process of claim 9, wherein the thermoplastic material comprises at least one material selected from the group consisting of acrylonitrile butadiene styrene ("ABS"), polystyrene, polycarbonate, acrylic, Polyvinyl chloride ("PVC"), polyethylene terephthalate) ("PET") and polyethylene.

13. The process of claim 9, wherein the temperature sufficient to thermoform the substrate is greater than or equal to a glass transition temperature of the substrate.

14. The process of claim 9, wherein the flexible circuit conforms to at least one non-planar surface of the three-dimensional part.

15. The process of claim 9, wherein attaching of the flexible circuit to the three-dimensional part comprises at least one technique selected from the group consisting of i) employing an adhesive between the flexible circuit and the three-dimensional part; ii) mechanically fastening the flexible circuit to the three-dimensional part; and iii) welding the substrate to the three-dimensional part using a welding process that is suitable for welding the thermoplastic material.

16. The process of claim 9, wherein the electrically conductive lines comprise a material selected from the group consisting of silver, silver alloys, copper, copper alloys, gold, gold alloys, carbon-based conductive materials, and mixtures thereof.

17. The process of claim 9, wherein the heating of the flexible circuit occurs prior to attaching the flexible circuit to the three-dimensional part.

18. The process of claim 9, wherein the flexible circuit is a first sub-circuit of a multi-layer electrical circuit, the process further comprising:
providing a second substrate comprising a thermoplastic material on the first sub-circuit; and
depositing second electrically conductive lines on the second substrate to form a second flexible sub-circuit.

19. The process of claim 18, further comprising bonding the second flexible sub-circuit to the first sub-circuit.

* * * * *